US009576086B2

(12) United States Patent
Chiang et al.

(10) Patent No.: US 9,576,086 B2
(45) Date of Patent: Feb. 21, 2017

(54) MOTOR SIMULATOR WITHOUT REQUIRING A MOTOR

(71) Applicant: Chung-Shan Institute of Science and Technology, Armaments Bureau, M.N.D, Taoyuan County (TW)

(72) Inventors: Hsuang-Chang Chiang, Taoyuan County (TW); Chao-Tsung Ma, Taoyuan County (TW); Kun-Feng Chen, Taoyuan County (TW); Yu-Min Liao, Taoyuan County (TW)

(73) Assignee: NATIONAL CHUNG SHAN INSTITUTE OF SCIENCE AND TECHNOLOGY, Taoyuan (TW)

( * ) Notice: Subject to any disclaimer, the term of this patent is extended or adjusted under 35 U.S.C. 154(b) by 590 days.

(21) Appl. No.: 14/196,256

(22) Filed: Mar. 4, 2014

(65) Prior Publication Data
US 2015/0254377 A1 Sep. 10, 2015

(51) Int. Cl.
*G06G 7/48* (2006.01)
*G06F 17/50* (2006.01)

(52) U.S. Cl.
CPC ....... *G06F 17/5009* (2013.01); *G06F 17/5036* (2013.01); *G06F 17/5095* (2013.01); *Y02T 10/82* (2013.01)

(58) Field of Classification Search
CPC .............. G06F 17/5009; G06F 17/5095; G06F 17/5036; Y02T 10/82

USPC ............................................................ 703/7
See application file for complete search history.

(56) References Cited

U.S. PATENT DOCUMENTS

| 8,108,191 B1* | 1/2012 | Britch | G01M 13/02 318/139 |
|---|---|---|---|
| 2012/0226486 A1* | 9/2012 | Plocek | G09B 25/02 703/7 |
| 2013/0090886 A1* | 4/2013 | Pueschl | G05B 17/02 702/113 |

* cited by examiner

*Primary Examiner* — Dwin M Craig
(74) *Attorney, Agent, or Firm* — Chun-Ming Shih

(57) ABSTRACT

A motor simulator without requiring a motor is a testing motor controller used for inputting a driving signal according to a power supply driving signal, feeding back a status response of a dynamic calculator of the motor simulator, outputting a voltage and current reference command value required by the motor simulator to the motor simulator, so that the dynamic calculator and the electric power converter installed in the motor simulator generate a voltage and a current of an actual motor in an operating status. Therefore, the testing motor controller keeps converting and adjusting the electric energy for driving an operation of the motor simulator according to a status response fed back by the dynamic calculator of the motor simulator, so as to achieve a control function of the testing motor controller for testing the rotation speed and positioning of the motor.

3 Claims, 3 Drawing Sheets

MOTOR SIMULATOR WITHOUT REQUIRING A MOTOR

BACKGROUND OF THE INVENTION

1. Field of Invention

The present invention relates to a motor simulator without requiring a motor, in particular to an electric motor simulation architecture without requiring a motor which uses a motor simulation method to substitute a motor coupled to a generator set, and employs an electric power converter to simulate the voltage and current outputted from a testing motor and coupled to a testing motor controller, so as to achieve the effect of requiring no electric motor.

2. Description of Related Art

A high-performance electric motor such as a power motor of an electric car, a servomotor of a machine tool, a frequency conversion motor of an air conditioner, etc requires a driver (or a controller) to convert and control electric power, so that a feedback control can control the rotation speed and the positioning. With reference to FIG. 1 for a conventional motor controller testing method, the testing method involves a power supply 11, a testing motor controller 12, a motor 13, and a load 14, wherein the testing motor controller 12 is provided for converting the electric power of the power supply 11 and then using the converted electrical energy to drive the motor 13 to rotate, and then feeding back an electric signal for driving the motor 13 to rotate the load 14 to the testing motor controller 12, so that the testing motor controller 12 keeps converting and adjusting electrical energy to drive the motor 13 to rotate according to the electric signal, so as to achieve the control functions for the testing motor controller 12 to test the rotation speed and positioning of the motor 13.

However, the conventional motor controller testing method still has the following drawbacks. Since there are various different types of electric motors, loads and driving sources, therefore it is difficult to install all of the drivers used for testing the electric motors in a laboratory.

Therefore, manufacturers have developed a motor coupled to a generator set (M-G set) to produce a simulated system as shown in FIG. 2, wherein the simulated system comprises a power supply 21, a testing motor controller 22, a motor 23, and a generator 24. The motor 23 is coupled to the generator 24 to form a motor coupled to a generator set 25, and the generator 24 acts as a load, and the load of the generator is changed to change the motor load, so that the testing motor controller 22 can convert the electric power of the power supply 21, and drives the motor 23 to rotate by the converted electrical energy, and an electric signal of the motor 23 for rotating the generator 24 is fed back to the testing motor controller 22, so that the testing motor controller 22 keeps converting and adjusting the electrical energy for driving the motor 23 to rotate according to the electric signal, so as to achieve a control function of the testing motor controller 22 for testing the rotation speed and positioning of the motor 23.

However, the simulation system has the following drawbacks: 1. In general, a motor acting as a load and a driving source must have a capacity much greater than the capacity of the testing motor (at least three times as much) before a dynamic response of an actual system can be simulated for testing the capability of the driving system, and thus incurring a very high cost. 2. If the controller is applied for various different electric motors, the testing requires different mechanisms to fit various different types of electric motors, and thus incurring a high cost. 3. For applications on electric motors that have not been tested, online calibrations or adjustments of the devices are required before a good performance can be achieved.

Obviously, the conventional simulation system has many drawbacks and requires further improvements.

SUMMARY OF THE INVENTION

In view of the aforementioned drawbacks of the prior art, the inventor of the present invention based on years of experience in the related industry to conduct extensive researches and experiments, and finally developed a novel motor simulator without requiring a motor to overcome the drawbacks of the prior art.

Therefore, it is a primary objective of the present invention to provide a motor simulator without requiring a motor and uses a motor simulation method to substitute a motor coupled to a generator set and simulate a voltage and a current of a testing electric motor outputted from an electric power converter, and the motor simulator is coupled to the testing electric motor controller to achieve the effect of an electric motor simulation architecture without requiring an electric motor.

Another objective of the present invention is to provide a motor simulator without requiring a motor, so that no actual motor hardware is required, and the additional hardware cost can be saved, and the motor simulator provides extensive applications and fits various different types of electric motor.

To achieve the foregoing and other objectives, the present invention provides a motor simulator without requiring a motor and comprises a motor simulator, a testing motor controller and a power supply driving signal, wherein the motor simulator comprises an analog/digital converter, a dynamic calculator, an electric power converter and a digital/analog converter. The motor simulator is provided for simulating the characteristic of a motor combined with a load, providing a verification platform to the testing motor controller, and outputting electric power from the electric power converter to achieve energy recycle. The analog/digital converter is provided for converting an analog power signal into a digital control signal. The dynamic calculator is provided for computing a dynamic response (such as the rotor position and rotation speed parameter of the motor) of the motor combined with the load, and providing a feedback control of the testing motor controller. The electric power converter is provided for adjusting and controlling a control parameter according to a voltage and current reference command value outputted from the testing motor controller and the rotor position and rotation speed parameter of the dynamic calculator to generate a voltage, and feeding back the electric power of the output voltage to a power supply side to complete a recycle of the electric power, so that the electric power used for the testing can be recycled. The digital/analog converter is provided for converting a digital control signal into an analog power signal. The testing motor controller is a device electrically coupled to the motor simulator for driving the motor simulator to operate. The power supply driving signal is electrically coupled to the testing motor controller for computing a power supply driving composite signal of the testing motor controller. Therefore, the testing motor controller can output a voltage and current reference command value required by the motor simulator to the motor simulator according to a driving signal inputted from the power supply driving signal and a status response fed back by the dynamic calculator of the motor simulator, so that the dynamic calculator and the electric power converter installed in the motor simulator generate actual voltage and current which are the voltage and current of an actual motor at an operating status. Therefore, the testing motor controller keeps converting and adjusting the electrical energy for driving the motor simulator to operate according to the driving signal inputted from the power supply driving signal and the status response fed back by the dynamic calculator of the motor simulator, so as to achieve a control function of the testing motor controller for testing the rotation speed and positioning of the motor.

BRIEF DESCRIPTION OF THE DRAWINGS

The technical characteristics and objectives of the present invention can be further understood by the following detailed description of preferred embodiments and related drawings in which.

DETAILED DESCRIPTION OF THE INVENTION

Figure 1:
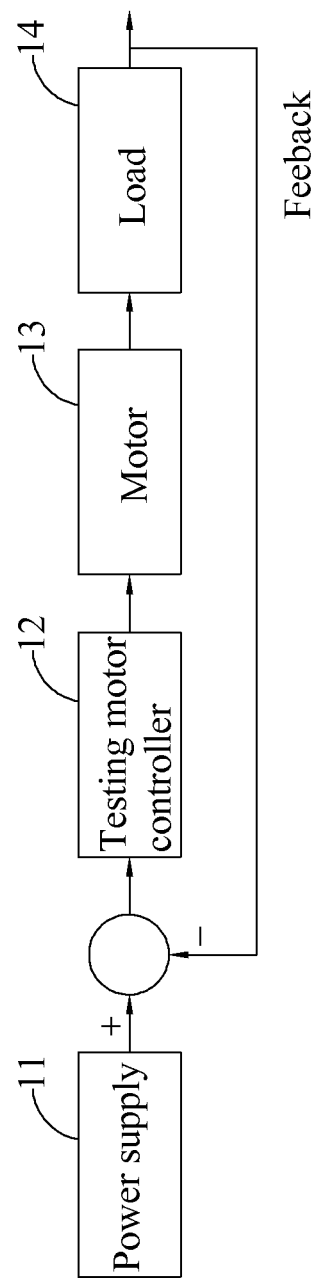
FIG. 1 is a schematic view of a conventional motor controller testing method.
Figure 2:
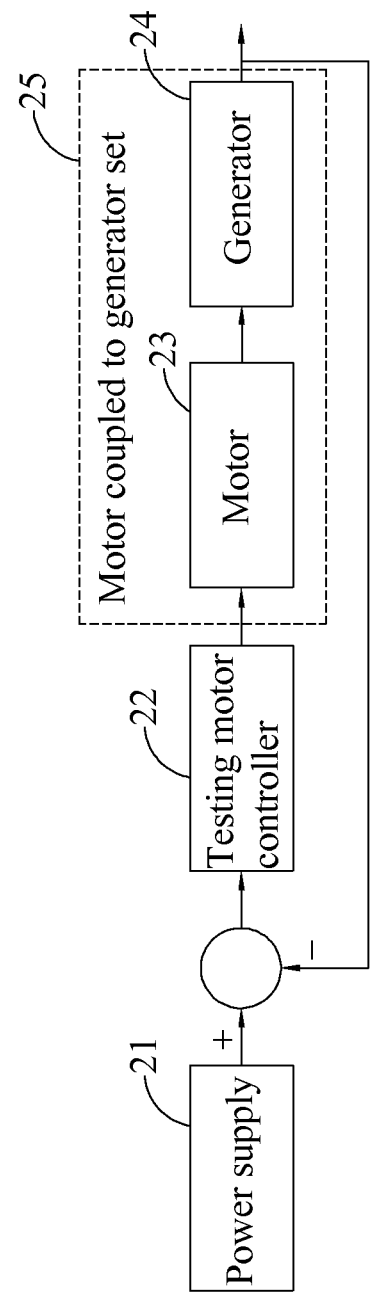
FIG. 2 is a schematic view of a conventional motor controller testing system adopting a motor coupled to a generator set.
Figure 3:
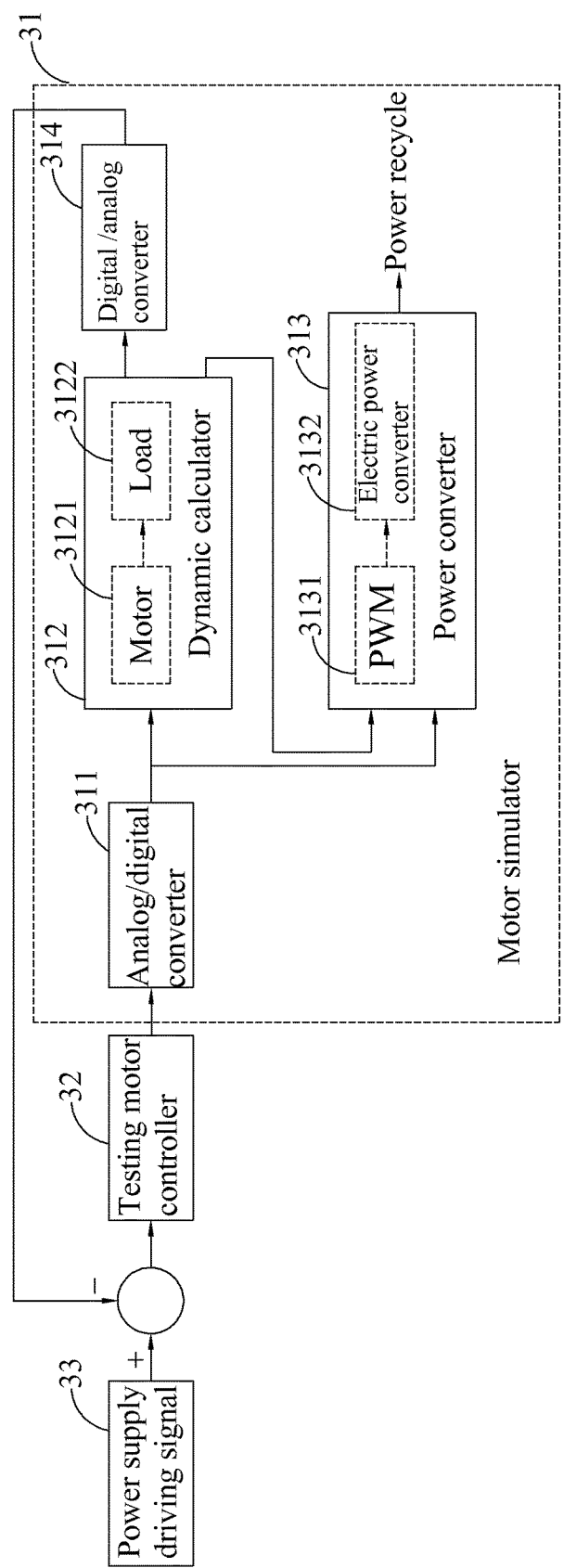
FIG. 3 is a schematic circuit block diagram of a motor simulator without requiring a motor in accordance with the present invention.

With reference to FIG. 3 for a motor simulator without requiring a motor in accordance with the present invention, the present invention comprises a motor simulator 31, a testing motor controller 32 and a power supply driving signal 33.

Wherein, the motor simulator 31 comprises an analog/digital converter 311, a dynamic calculator 312, an electric power converter 313 and a digital/analog converter 314, and the motor simulator 31 is provided for simulating the characteristic of a motor coupled to a load, providing a verification platform to the testing motor controller 32, and outputting electric power through an electric power converter to achieve energy recycle.

Wherein, the analog/digital converter 311 is electrically coupled to the testing motor controller 32 for converting an analog power signal into a digital control signal.

The dynamic calculator 312 is electrically coupled to the analog/digital converter 311 for computing a dynamic response (such as the rotor position and rotation speed parameter of the motor) of a motor combined with a load, and providing a feedback control of the testing motor controller 32.

The electric power converter 313 is electrically coupled to the analog/digital converter 311 and the dynamic calculator 312 for adjusting and controlling a control parameter according to a voltage and current reference command value outputted by the testing motor controller 32 and the rotor position and rotation speed parameter of the dynamic calculator 312 to generate an output voltage, and feeding back the electric power of the output voltage to a power supply side to complete the recycle of electric power, so that the electric power used for the testing can be recycled.

The digital/analog converter 314 is electrically coupled to the dynamic calculator 312 and the testing motor controller 32 for converting a digital control signal into an analog power signal. The testing motor controller 32 is a device electrically coupled to the motor simulator 31 for driving the motor simulator 31 to operate.

The power supply driving signal 33 is electrically coupled to the testing motor controller 32 for computing a power supply driving composite signal of the testing motor controller 32.

With the aforementioned assembly used for testing, the testing motor controller 32 outputs a voltage and current reference command value required by the motor simulator 31 to the motor simulator 31 according to the driving signal inputted from the power supply driving signal 33 and the status response fed back by the dynamic calculator 312 of the motor simulator 31, so that the dynamic calculator 312 and the electric power converter 313 installed in the motor simulator 31 generate actual voltage and current which are the voltage and current of an actual motor at an operating status. The testing motor controller 32 keeps converting and adjusting the electric energy for driving the motor simulator 31 to operate according to the driving signal inputted from the power supply driving signal 33 and the status response fed back by the dynamic calculator 312 of the motor simulator 31, so as to achieve a control function of the testing motor controller 32 for testing the rotation speed and positioning of the motor.

In FIG. 3, the dynamic calculator 312 has a motor simulation circuit 3121 and a load simulation circuit 3122, wherein the motor simulation circuit 3121 creates dynamic parameters of various different types of motors by a digital modeling method, and the load simulation circuit 3122 creases a load characteristic by a digital simulation method, and the parameters include various linear or nonlinear load parameters.

In FIG. 3, the electric power converter 313 is comprised of a pulse width modulator (PWM) 3131 and a power converter 3132, wherein the PWM 3131 changes a pulse width modulation method to drive the power converter 3132, and the power converter 3132 is controlled by the PWM 3131 output electric power.

In FIG. 3, the testing motor controller 32 outputs the voltage and current reference command value to the motor simulator 31, wherein the analog/digital converter 311 converts the analog power signal into the digital control signal first, and then transmits the digital control signal to the dynamic calculator 312 and the electric power converter 313.

In FIG. 3, the dynamic calculator 312 computes the dynamic response of the motor combined with the load, wherein the digital/analog converter 314 converts the digital control signal into the analog power signal first, and then feeds back the analog power signal to the testing motor controller 32.

In summation of the description above, the present invention improves over the prior art and complies with the patent application requirements, and thus is duly filed for patent application.

While the invention has been described by means of specific embodiments, numerous modifications and variations could be made thereto by those skilled in the art without departing from the scope and spirit of the invention set forth in the claims.

What is claimed is:

1. A motor simulator without requiring a motor, comprising:
   a testing motor controller, which is a device for driving the motor simulator to operate;
   a motor simulator, for simulating the characteristic of combining a motor with a load, providing a verification platform to the testing motor controller, and outputting electric power from an electric power converter to achieve an energy recycle, and comprising:

an analog/digital converter, electrically coupled to the testing motor controller, for converting an analog power signal into a digital control signal;

a dynamic calculator, electrically coupled to the analog/digital converter, for computing a dynamic response of the motor combined with the load, and providing a feedback control of the testing motor controller;

an electric power converter, electrically coupled to the analog/digital converter and the dynamic calculator, for controlling a control parameter according to a voltage and current reference command value outputted by the testing motor controller and a rotor position and rotation speed parameter of the dynamic calculator to produce an output voltage, so as to feed back the electric power of the output voltage to a power supply side; and a digital/analog converter, electrically coupled to the dynamic calculator and the testing motor controller, for converting the digital control signal into the analog power signal; and a power supply driving signal, electrically coupled to the testing motor controller, for computing a power supply driving composite signal of the testing motor controller;

thereby, the testing motor controller outputs the voltage and current reference command value required by the motor simulator to the motor simulator according to a driving signal inputted from the power supply driving signal and a status response fed back from the dynamic calculator of the motor simulator, so that the dynamic calculator and the electric power converter installed in the motor simulator generate a voltage and a current for an actual motor in an operating status, and the testing motor controller keeps converting and adjusting electrical energy for driving an operation of the motor simulator according to the driving signal inputted from the power supply driving signal and the status response fed back from the dynamic calculator of the motor simulator, so as to achieve a control function of the testing motor controller for testing the rotation speed and positioning of the motor.

2. The motor simulator without requiring a motor according to claim 1, wherein the dynamic calculator includes a motor simulation circuit and a load simulation circuit, and the motor simulation circuit creates various types of motor dynamic parameters, and the load simulation circuit creates a load characteristics.

3. The motor simulator without requiring a motor according to claim 1, wherein the electric power converter is comprised of a pulse width modulator (PWM) and a power converter, and the PWM changes a pulse width modulation method to drive the power converter, and the power converter is controlled by the PWM to output electric power.

* * * * *